United States Patent
Beh et al.

(10) Patent No.: US 10,468,337 B2
(45) Date of Patent: Nov. 5, 2019

(54) PACKAGE FOR AN ELECTRONIC COMPONENT, ELECTRONIC COMPONENT AND ELECTRONIC ARRANGEMENT

(71) Applicant: OSRAM Opto Semiconductors GmbH, Regensburg (DE)

(72) Inventors: Sok Gek Beh, Gelugor (MY); Siew Lee Yeoh, Bayan Lepas (MY); Wing Yew Wong, Jelutong (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/775,584

(22) PCT Filed: Nov. 12, 2015

(86) PCT No.: PCT/EP2015/076461
§ 371 (c)(1),
(2) Date: May 11, 2018

(87) PCT Pub. No.: WO2017/080605
PCT Pub. Date: May 18, 2017

(65) Prior Publication Data
US 2018/0374784 A1 Dec. 27, 2018

(51) Int. Cl.
*H01L 23/495* (2006.01)
*H01L 25/075* (2006.01)
(Continued)

(52) U.S. Cl.
CPC .. *H01L 23/49575* (2013.01); *H01L 23/49541* (2013.01); *H01L 23/49805* (2013.01); *H01L 24/48* (2013.01); *H01L 25/0753* (2013.01); *H01L 33/486* (2013.01); *H01L 33/62* (2013.01); *H01L 23/49568* (2013.01); *H01L 2224/48137* (2013.01); *H01L 2224/48247* (2013.01)

(58) Field of Classification Search
CPC ......... H01L 23/49575; H01L 23/49541; H01L 23/49805; H01L 23/49568; H01L 25/0753; H01L 24/48; H01L 2224/48247; H01L 2224/48137; H01L 33/486; H01L 33/62
See application file for complete search history.

(56) References Cited

U.S. PATENT DOCUMENTS

2008/0179618 A1* 7/2008 Cheng .................. H01L 33/486
257/99
2008/0298063 A1 12/2008 Hayashi
(Continued)

FOREIGN PATENT DOCUMENTS

| EP | 2 408 031 A2 | 1/2012 |
| JP | 2007-95796 A | 4/2007 |
| JP | 2012-039121 A | 2/2012 |

OTHER PUBLICATIONS

Notice of Reasons for Rejection dated Mar. 12, 2019, of counterpart Japanese Application No. 2018-519930, along with an English translation.

*Primary Examiner* — Yosef Gebreyesus
(74) *Attorney, Agent, or Firm* — DLA Piper LLP (US)

(57) ABSTRACT

A package for an electronic component includes a housing and a leadframe embedded in the housing. The leadframe includes a first section, a second section and a third section which are electrically isolated from one another. The first section and the second section each include an L-shape.

14 Claims, 9 Drawing Sheets

(51) Int. Cl.
H01L 33/48 (2010.01)
H01L 33/62 (2010.01)
H01L 23/498 (2006.01)
H01L 23/00 (2006.01)

(56) References Cited

U.S. PATENT DOCUMENTS

2009/0283781 A1* 11/2009 Chan ................... H01L 25/0753
 257/89
2011/0186875 A1 8/2011 Egoshi et al.
2012/0044656 A1* 2/2012 Lu ........................ H01F 27/306
 361/748
2014/0203384 A1 7/2014 Deak et al.

* cited by examiner

PACKAGE FOR AN ELECTRONIC COMPONENT, ELECTRONIC COMPONENT AND ELECTRONIC ARRANGEMENT

TECHNICAL FIELD

This disclosure relates to a package for an electronic component, an electronic component and an electronic arrangement.

BACKGROUND

Various packages for electronic components are known. However, there is a need for an improved package for an electronic component.

SUMMARY

We provide a package for an electronic component including a housing and a leadframe embedded in the housing, wherein the leadframe includes a first section, a second section and a third section electrically isolated from one another, and the first section and the second section each include an L-shape.

We also provide an electronic component including a package wherein the housing includes a cavity, and at least parts of upper sides of the first section, the second section and the third section of the leadframe are exposed in the cavity, and an electronic semiconductor chip arranged in the cavity on the upper side of the third section.

We further provide an electronic arrangement including at least two electronic components including a package wherein the housing includes a cavity, and at least parts of upper sides of the first section, the second section and the third section of the leadframe are exposed in the cavity, and an electronic semiconductor chip arranged in the cavity on the upper side of the third section.

Figure 1:
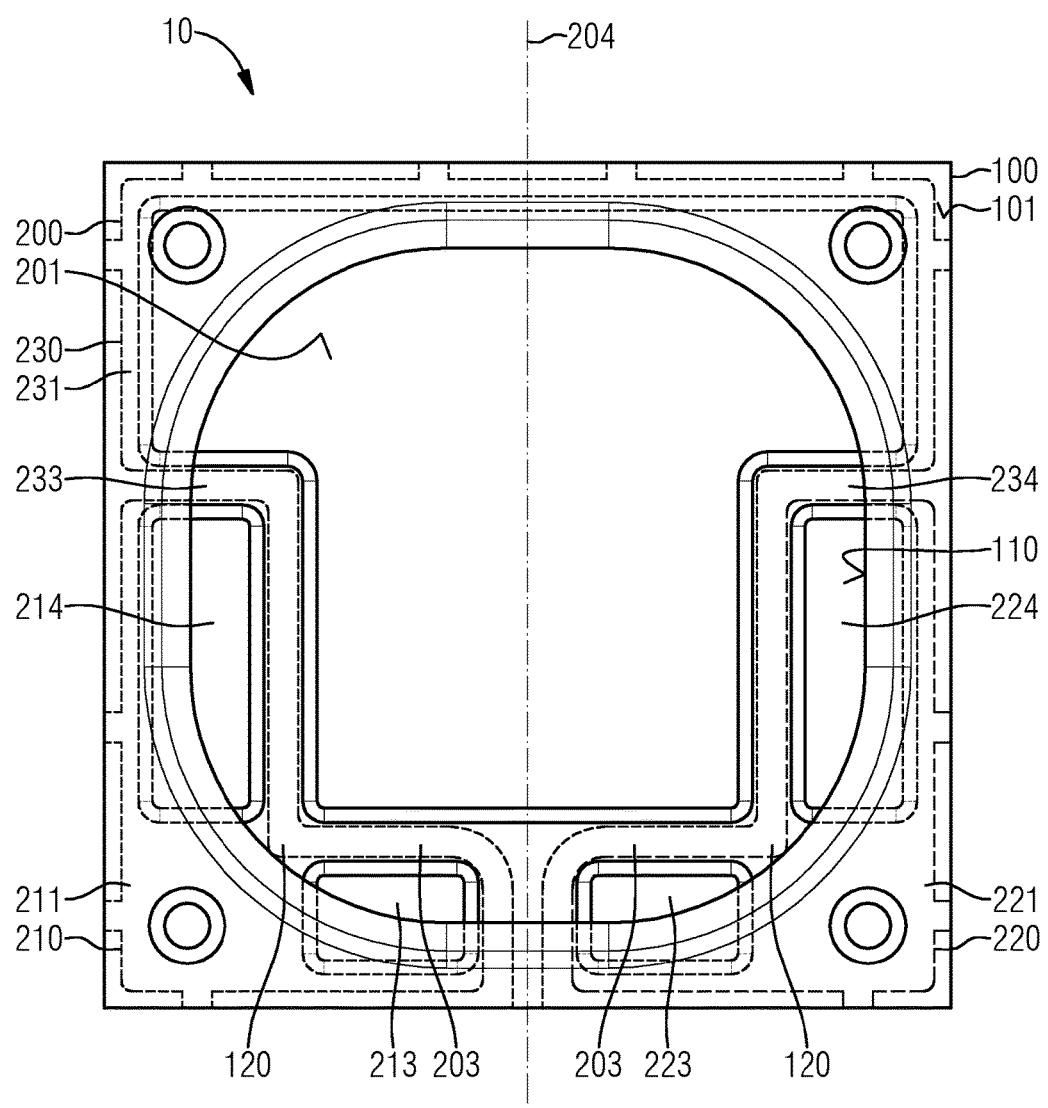
FIG. 1 schematically shows a partially transparent view of an upper side of a package.

REFERENCE NUMBERS 10 package
20 electronic component
30 electronic arrangement
100 housing
101 upper side
102 bottom side
110 cavity
120 fillet
200 leadframe
201 upper side
202 bottom side
203 gap
204 mirror axis
210 first section
211 upper side
212 bottom side
213 first part
214 second part
220 second section
221 upper side
222 bottom side
223 first part
224 second part
230 third section
231 upper side
232 bottom side
233 first clearance
234 second clearance
300 electronic semiconductor chip
301 first electronic semiconductor chip
302 second electronic semiconductor chip
303 third electronic semiconductor chip
304 fourth electronic semiconductor chip
310 first contact pad
320 second contact pad
330 bond wire
340 conductive connection

DETAILED DESCRIPTION

Our package for an electronic component comprises a housing and a leadframe embedded in the housing. The leadframe comprises a first section, a second section and a third section electrically isolated from one another. The first section and the second section each comprise an L-shape.

Advantageously, the L-shaped first section and second section of the leadframe of this package may offer multiple wire bond positions for connecting bond wires that electrically connect electronic semiconductor chips to the first section and the second section of the leadframe of this package. This makes it possible to arrange different kinds of electronic semiconductor chips at different possible orientations in this package. Advantageously, this makes it possible to use the package for different applications and in different configurations.

The first section and the second section may be mirror symmetric with respect to each other. Advantageously, this allows for a space saving and mechanically robust construction of the package.

The leadframe may be mirror symmetric. Advantageously, this allows for a compact and mechanically robust construction of the package.

The third section may comprise a first clearance and a second clearance. The first clearance and the second clearance each comprise an L-shape. The first section is arranged in the first clearance and the second section is arranged in the second clearance. The first section, the second section and the third section of the leadframe may combine to comprise a rectangular shape. Advantageously, this allows for a compact design of the package and allows for a material-saving production of the leadframe of the package.

At least parts of bottom sides of the first section, the second section and the third section of the leadframe may be exposed at a bottom side of the housing. Advantageously, the exposed bottom sides of the first section, the second section and the third section of the leadframe of this package allow for mounting the package on a surface. The package may, for example, be mountable by an SMT method, for example, by reflow soldering. The bottom sides of the first section and the second section of the leadframe of the package may, for example, electrically connect the package. The bottom side of the third section of the leadframe may thermally connect the package.

The housing may comprise a cavity. At least parts of upper sides of the first section, the second section and the third section of the leadframe are exposed in the cavity. Advantageously, the cavity of the housing of the package may receive one or more electronic semiconductor chips. The electronic semiconductor chips may electrically and thermally connect to the exposed upper sides of the sections of the leadframe of the housing in the cavity. The cavity may also receive a potting compound to protect the electronic semiconductor chips arranged in the cavity.

A first part and a second part of the upper side of the first section may be exposed in the cavity. A fillet of the housing covers an area of the upper side of the first section between the first part and the second part. Advantageously, the first part and the second part of the upper side of the first section may each serve as independent bond wire pads to connect bond wires. This allows for use of the package in multiple configurations.

Our electronic component comprises a package of the aforementioned kind and an electronic semiconductor chip arranged in the cavity on the upper side of the third section. Advantageously, the third section of the leadframe of the package of this electronic component may serve as a thermal pad to remove heat generated in the electronic semiconductor chip during operation of the electronic component. The third section may be electrically isolated from electric contact pads of the electronic semiconductor chip.

The electronic component may comprise at least two electronic semiconductor chips arranged on the upper side of the third section. At least two of the electronic semiconductor chips electrically connect to the first section and the second section in a serial configuration. Advantageously, the serial configuration allows for operation of the two electronic semiconductor chips with identical electric currents.

The electronic component may comprise at least two electronic semiconductor chips arranged on the upper side of the third section. At least two of the electronic semiconductor chips electrically connect to the first section and the second section in a parallel configuration. Advantageously, this configuration facilitates driving the two electronic semiconductor chips with identical drive voltages.

An electronic arrangement comprises at least two electronic components of the aforementioned kind. The electronic components may, for example, be light emitting components. The electronic arrangement comprising at least two electronic components may then be designed to emit a large quantity of light.

In the electronic arrangement, at least two of the electronic components may electrically connect in a serial configuration. This facilitates driving the two electronic components with identical drive currents.

At least two of the electronic components may electrically connect in a parallel configuration. This facilitates driving the two electronic components with identical drive voltages.

The above-described properties, features and advantages, as well as the way in which they are achieved, will become more clearly and comprehensively understandable in connection with the following description of examples, which will be explained in more detail in connection with the drawings.

Figure 2:
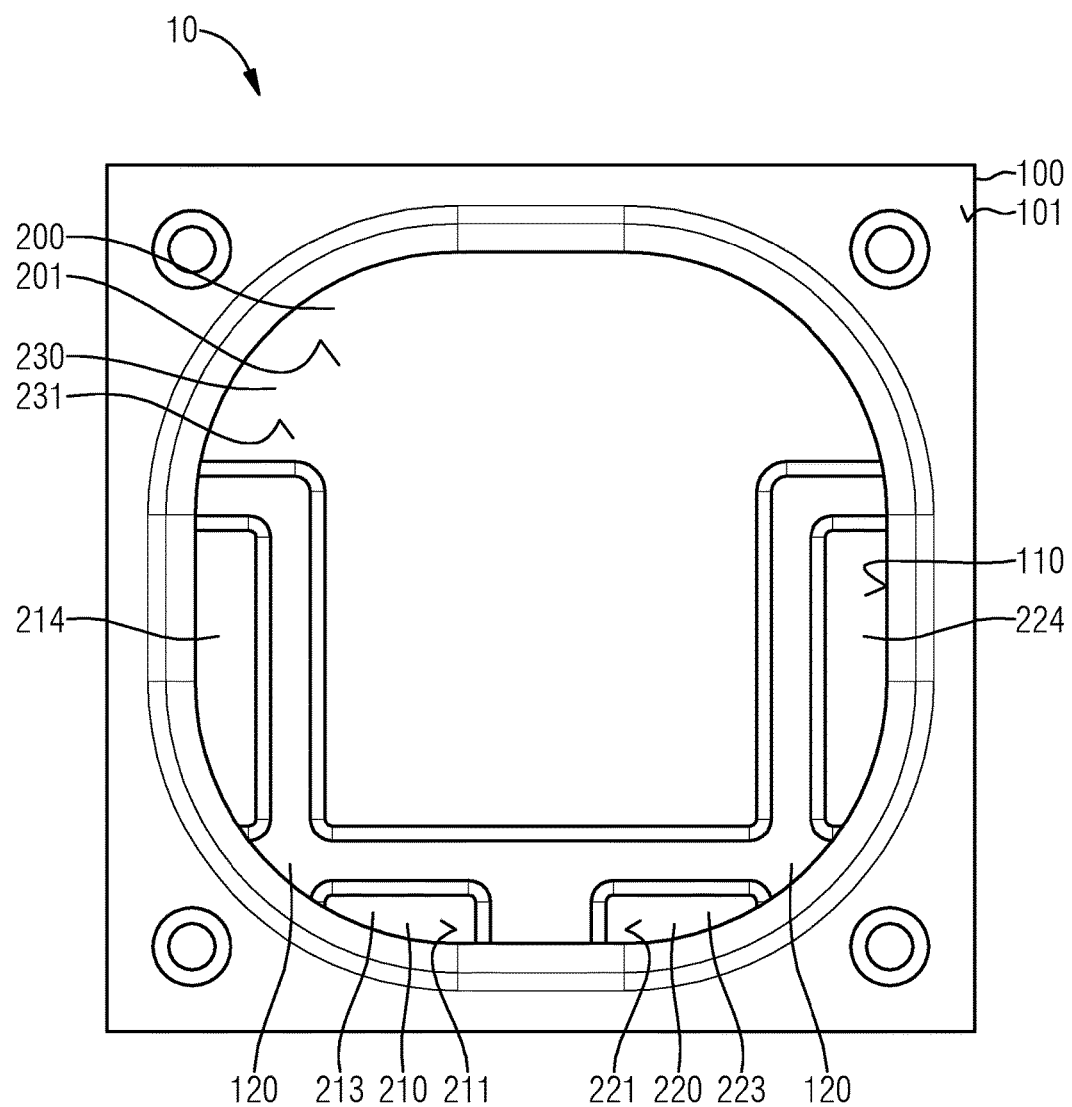
FIG. 2 schematically shows a further view of the upper side of the package.
Figure 3:
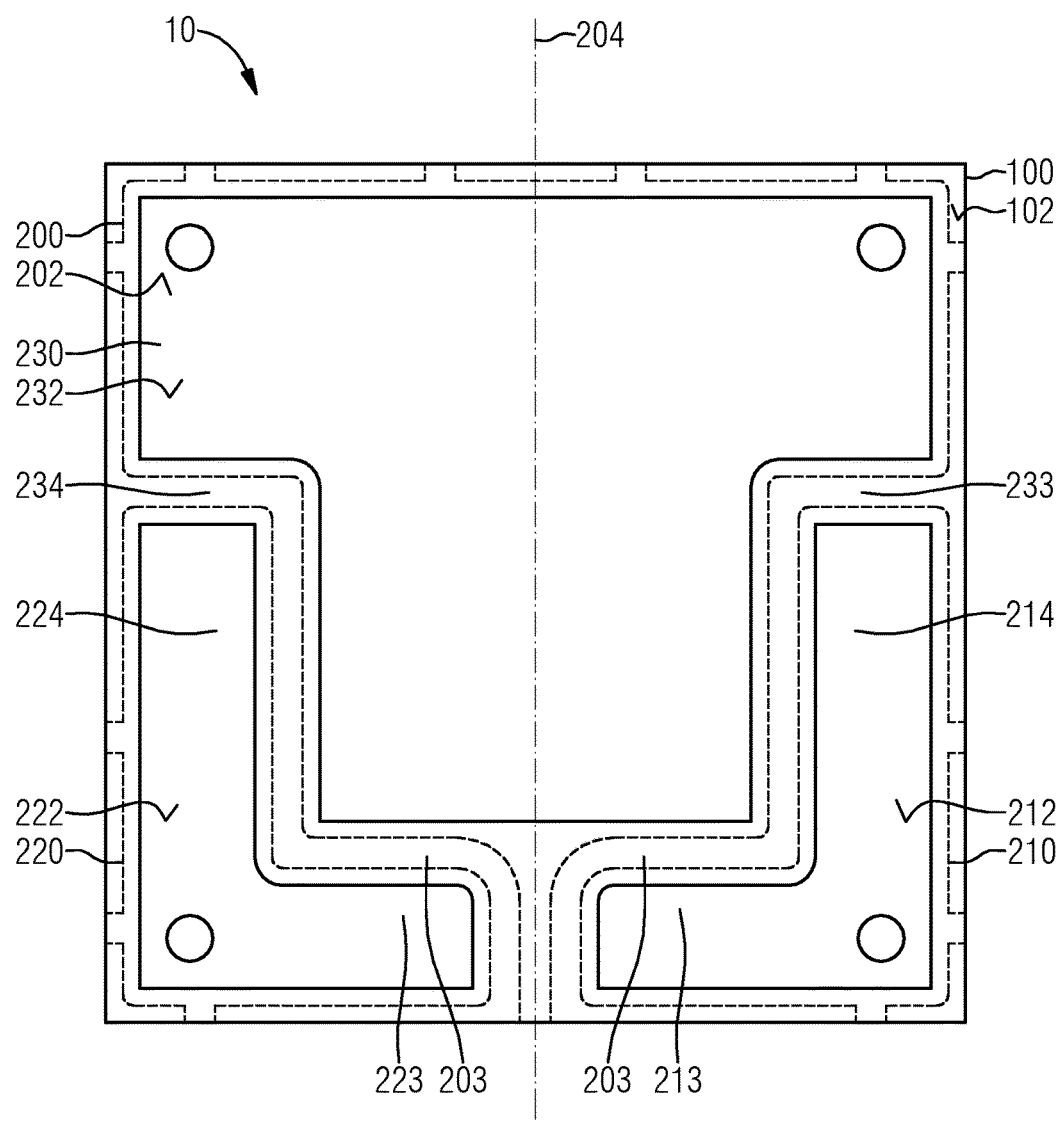
FIG. 3 schematically shows a view of a bottom side of the package.

FIG. 1 shows a schematic transparent top view of a package 10 for an electronic component. FIG. 2 shows a schematic nontransparent top view of the package 10. FIG. 3 shows a schematic bottom view of the package 10.

The package 10 comprises a housing 100. The housing 100 comprises an upper side 101 and a bottom side 102 that is opposed to the upper side 101. At its upper side 101 the housing 100 comprises a cavity 110.

The housing 100 comprises an electrically isolating material, for example, a plastic material. The housing 100 may be produced by molding, for example, by transfer molding or injection molding.

The package 10 further comprises a leadframe 200. The leadframe 200 comprises a flat shape with an upper side 201 and a bottom side 202 opposed to the upper side 201.

The leadframe 200 comprises an electrically conductive material, for example, a metal. The leadframe 200 may, for example, be made from a metal sheet.

The leadframe 200 is at least partially embedded in the housing 100. Embedding the leadframe 200 in the housing 100 may have happened during production of the housing 100 by molding the material of the housing 100 around the leadframe 200.

The leadframe 200 is laterally divided into a first section 210, a second section 220 and a third section 230. The first section 210, the second section 220 and the third section 230 are each physically separated from one another, spaced apart from each other by a gap 203 and electrically isolated against each other. The first section 210, the second section 220 and the third section 230 of the leadframe 200 are held in position by the housing 100.

The first section 210 comprises an upper side 211 and a bottom side 212 opposed to the upper side 211. The second section 220 comprises an upper side 221 and a bottom side 222 opposed to the upper side 221. The third section 230 comprises an upper side 231 and a bottom side 232 opposed to the upper side 231. The upper side 211 of the first section 210, the upper side 221 of the second section 220 and the upper side 231 of the third section 230 together form the upper side 201 of the leadframe 200. The bottom side 212 of the first section 210, the bottom side 222 of the second section 220 and the bottom side 232 of the third section 230 together form the bottom side 202 of the leadframe 200.

The first section 210 and the second section 220 of the leadframe 200 each comprise the shape of the letter L. The first section 210 and the second section 220 are mirror symmetric with respect to each other. The third section 230 of the leadframe 200 comprises a first clearance 233 and a second clearance 234. The first clearance 233 and the second clearance 234 each comprise the shape of the letter L. The first section 210 of the leadframe 200 is arranged in the first clearance 233 of the third section 230. The second section 220 of the leadframe 200 is arranged in the second clearance 234 of the third section 230 of the leadframe 200. The L-shaped first section 210 and the L-shaped second section 220 of the leadframe 200 are each arranged at corners of the leadframe 200 such that each of the beams of the L-shape are aligned with outer edges of the leadframe 200. The first section 210, the second section 220 and the third section 230 combine to a roughly rectangular shape, in particular to a roughly square shape. The entire frame 200 is mirror symmetric with respect to a mirror axis 204.

At least parts of the bottom side 212 of the first section 210, the bottom side 222 of the second section 220 and the bottom side 232 of the third section 230 of the leadframe 200 are exposed at the bottom side 102 of the housing 100 of the package 10. In these exposed parts of the bottom sides 212, 222, 232, the bottom sides 212, 222, 232 of the first section 210, the second section 220 and the third section 230 are not covered by the material of the housing 100. It is convenient, that the entire bottom sides 212, 222, 232 of the first section 210, the second section 220 and the third section 230 are exposed at the bottom side 102 of the housing 100.

The exposed bottom sides 212, 222, 232 of the sections 210, 220, 230 of the leadframe 200 may electrically and/or thermally connect the package 10. The package 10 may, for example, be designed as an SMD package to be mounted on a surface by a method of surface mount technology, for example, by reflow soldering.

Parts of the upper side 211 of the first section 210, the upper side 221 of the second section 220 and the upper side 231 of the third section 230 of the leadframe 200 are exposed in the cavity 110 at the upper side 101 of the housing 100 of the package 10. The exposed parts of the upper sides 211, 221, 231 of the first section 210, the second section 220 and the third section 230 are not covered by the material of the housing 100. Other parts of the upper sides 211, 221, 231 of the sections 210, 220, 230 of the leadframe 200 are covered by the material of the housing 100.

A first part 213 and a second part 214 of the upper side 211 of the first section 210 are exposed in the cavity 110 at the upper side 101 of the housing 100. A fillet 120 formed from the material of the housing 100 covers an area of the upper side 211 of the first section 210 between the first part 213 and the second part 214 of the upper side 211 of the first section 210, thus separating the first part 213 from the second part 214 of the upper side 211 of the first section 210. Accordingly, a first part 223 and a second part 224 of the upper side 221 of the second section 220 are exposed in the cavity 110 at the upper side 101 of the housing 100. The fillet 120 covers an area of the upper side 221 of the second section 210 between the first part 223 and the second part 224 and separates the first part 223 from the second part 224.

In the example depicted in FIGS. 1 to 3, the third section 230 comprises a larger area than the first section 210 and the second section 220 of the leadframe 200. In particular, the bottom side 232 of the third section 230 is larger than the bottom side 212 of the first section 210 and larger than the bottom side 222 of the second section 220. The bottom side 232 of the third section 230 is even larger than the sum of the areas of the bottom side 212 of the first section 210 and the bottom side 222 of the second section 220. It is possible, however, that the sections 210, 220, 230 of the leadframe 200 have different areas.

Figure 4:
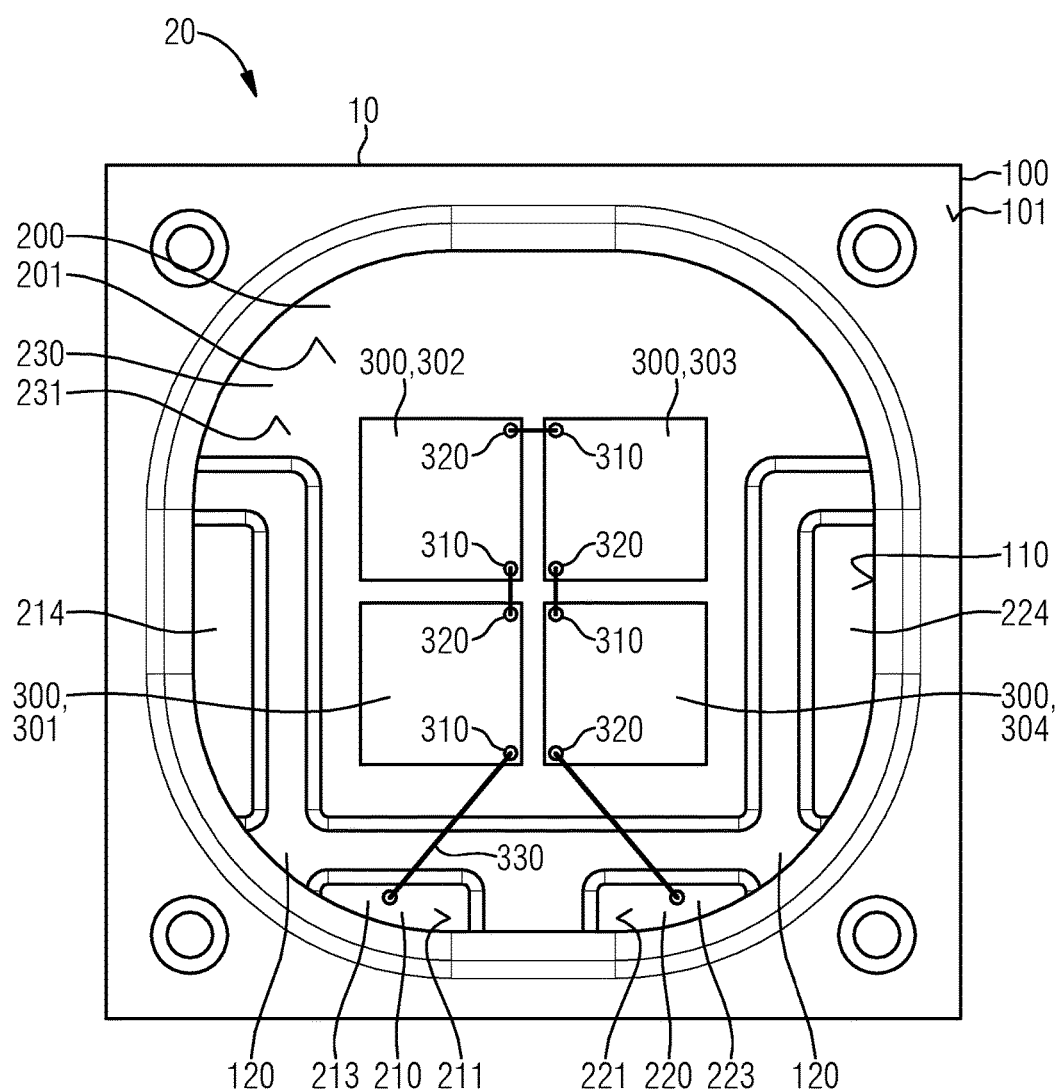
FIG. 4 schematically shows an electronic component according to a first example.

FIG. 4 shows a schematic top view of an electronic component 20. The electronic component 20 may be an optoelectronic component. The electronic component 20 may emit electromagnetic radiation, for example, visible light.

The electronic component 20 comprises the package 10 depicted in FIGS. 1 to 3. Additionally, the electronic component 20 comprises a plurality of electronic semiconductor chips 300, namely a first electronic semiconductor chip 300, 301, a second electronic semiconductor chip 300, 302, a third electronic semiconductor chip 300, 303 and a fourth electronic semiconductor chip 300, 304. The electronic semiconductor chips 300 may be optoelectronic semiconductor chips that emit electromagnetic radiation, for example, visible light. The electronic semiconductor chips 300 may, for example, be light emitting diode chips (LED chips).

Each electronic semiconductor chip 300 comprises a first contact pad 310 and a second contact pad 320. In the example shown in FIG. 4, the contact pads 310, 320 are arranged near corners of the rectangular upper sides of the electronic semiconductor chips 300. The contact pads 310, 320 may, however, be arranged at other positions of the electronic semiconductor chips 300.

The electronic semiconductor chips 300 are arranged in the cavity 110 of the housing 100 of the package 10 on the exposed part of the upper side 231 of the third section 230 of the leadframe 200 of the package 10. The electronic semiconductor chips 300 are arranged such that bottom sides of the electronic semiconductor chips 300 face the upper side 231 of the third section 230 of the leadframe 200 and connect to the upper side 231 of the third section 230. The electronic semiconductor chips 300 may, for example, be connected with a solder or a glue.

The electronic semiconductor chips 300 of the electronic component 20 electrically connect to the first section 210 and the second section 220 of the leadframe 200 of the package 10 in a serial configuration with bond wires 330. A first bond wire 330 extends from the first part 213 of the upper side 211 of the first section 210 of the leadframe 200 to the first contact pad 310 of the first electronic semiconductor chip 300, 301 to electrically connect the first section 210 of the leadframe 200 to the first contact pad 310 of the first electronic semiconductor chip 300, 301. A second bond wire 330 connects the second contact pad 320 of the first electronic semiconductor chip 300, 301 to the first contact pad 310 of the second electronic semiconductor chip 300, 302. A third bond wire 330 connects the second contact pad 320 of the second electronic semiconductor chip 300, 302 to the first contact pad 310 of the third electronic semiconductor chip 300, 303. A fourth bond wire 330 connects the second contact pad 320 of the third electronic semiconductor chip 300, 303 to the first contact pad 310 of the fourth electronic semiconductor chip 300, 304. A fifth bond wire 330 electrically connects the second contact pad 320 of the fourth electronic semiconductor chip 300, 304 to the first part 223 of the upper side 221 of the second section 220 of the leadframe 200.

The electronic component 20 can be electrically contacted via the bottom side 212 of the first section 210 of the leadframe 200 of the package 10 and the bottom side 222 of the second section 220 of the leadframe 200 of the package 10. Additionally, the electronic component 20 can be thermally contacted via the bottom side 232 of the third section 230 of the leadframe 200 of the package 10. Heat generated by the electronic semiconductor chips 300 of the electronic component 20 may be dissipated through the third section 230 of the leadframe 200.

Figure 5:
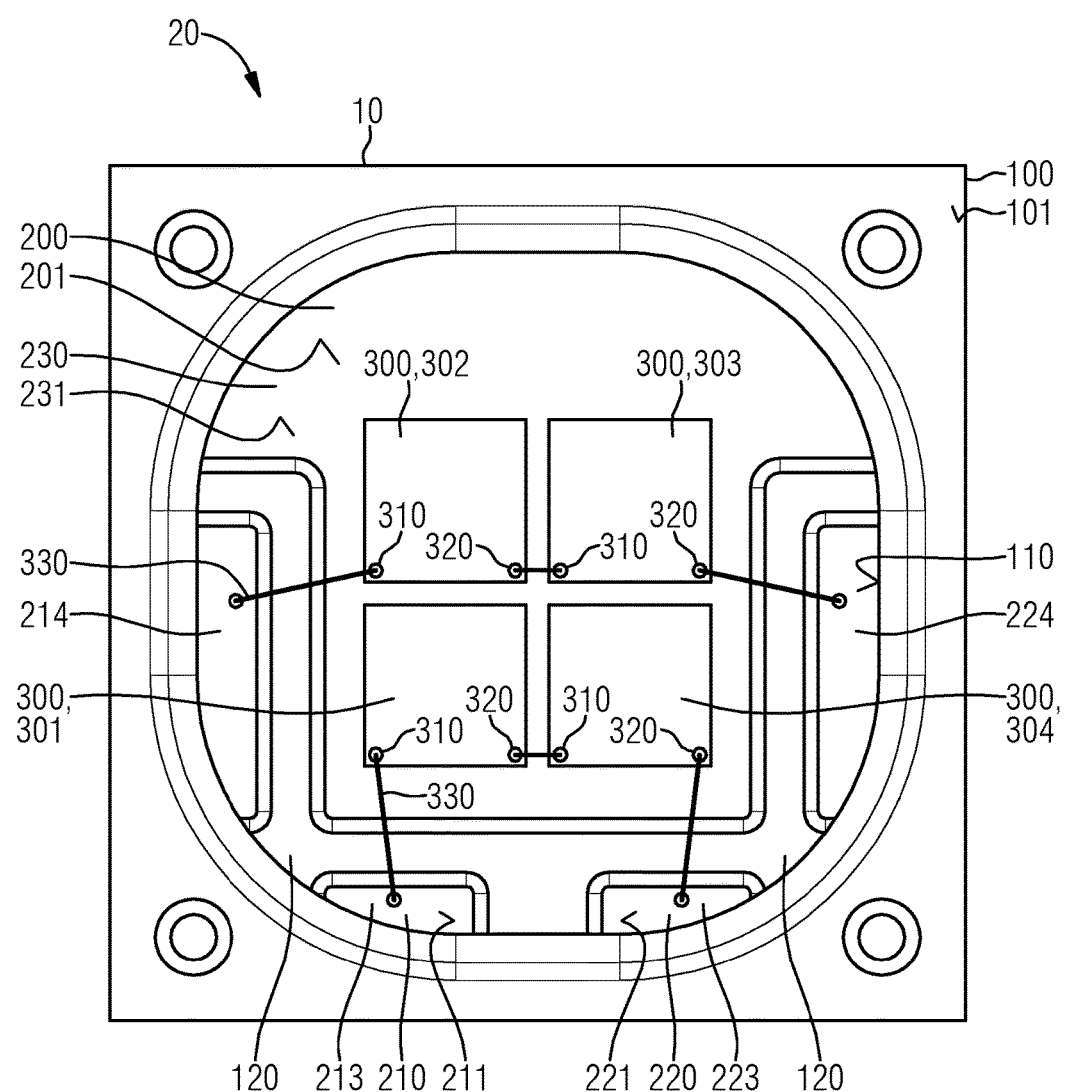
FIG. 5 schematically shows an electronic component according to a second example.

FIG. 5 shows a schematic top view of the electronic component 20 according to a second example. The second example of the electronic component 20 is similar to the first example of the electronic component 20 depicted in FIG. 4. In the following, only the differences between the second example of the electronic component 20 and the first example of the electronic component 20 are described.

In the second example of the electronic component 20, the electronic semiconductor chips 300 are divided into two groups. The first electronic semiconductor chip 300, 301 and the fourth electronic semiconductor chip 300, 304 are arranged in a first serial configuration. The second electronic semiconductor chip 300, 302 and the third electronic semiconductor chip 300, 303 are arranged in a second serial configuration connected in parallel to the first serial configuration of the first electronic semiconductor chip 300, 301 and the fourth electronic semiconductor chip 300, 304.

The first contact pad 310 of the first electronic semiconductor chip 300, 301 connects to the first part 213 of the upper side 211 of the first section 210 of the leadframe 200. The second contact pad 320 of the first electronic semiconductor chip 300, 301 connects to the first contact pad 310 of the fourth electronic semiconductor chip 300, 304. The second contact pad 320 of the fourth electronic semiconductor chip 300, 304 connects to the first part 223 of the upper side 221 of the second section 220 of the leadframe 200. The first contact pad 310 of the second electronic semiconductor chip 300, 302 electrically connects to the second part 214 of the upper side 211 of the first section 210 of the leadframe 200. The second contact pad 320 of the second electronic semiconductor chip 300, 302 connects to the first contact pad 310 of the third electronic semiconductor chip 300, 303. The second contact pad 320 of the third electronic semiconductor chip 300, 303 electrically connects to the second part 224 of the upper side 221 of the second section 220 of the leadframe 200.

Figure 6:
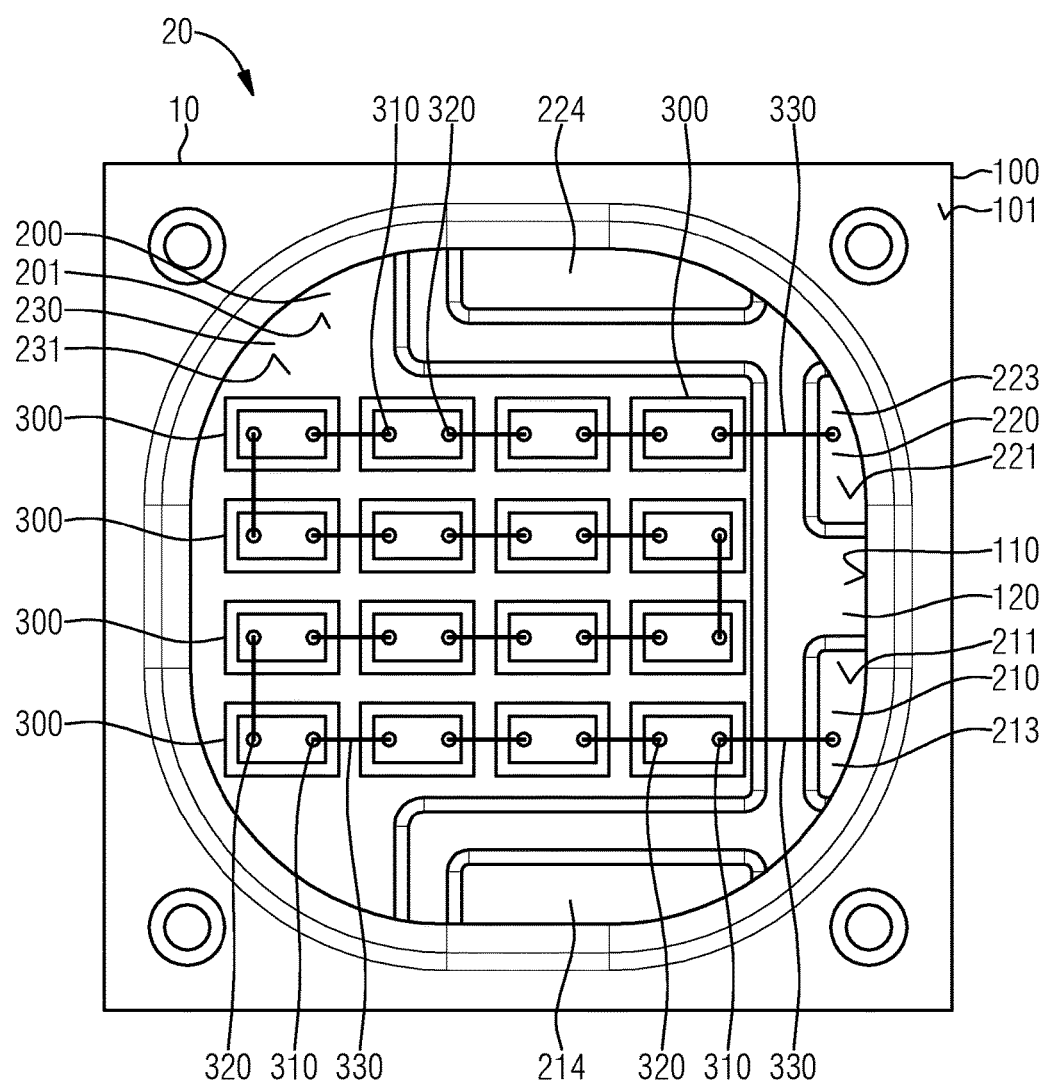
FIG. 6 schematically shows an electronic component according to a third example.

FIG. 6 shows a schematic top view of the electronic component 20 according to a third example. The third example of the electronic component 20 is similar to the first example of the electronic component 20 depicted in FIG. 4. In the following, only the differences between the third example of the electronic component 20 and the first example of the electronic component 20 are described.

The third example of the electronic component 20 comprises sixteen electronic semiconductor chips 300 arranged on the upper side 231 of the third section 230 of the leadframe 200 in the cavity 110 of the housing 100 of the package 10. The sixteen electronic semiconductor chips 300 electrically connect to the first section 210 and the second section 220 of the leadframe 200 in a serial configuration.

Figure 7:
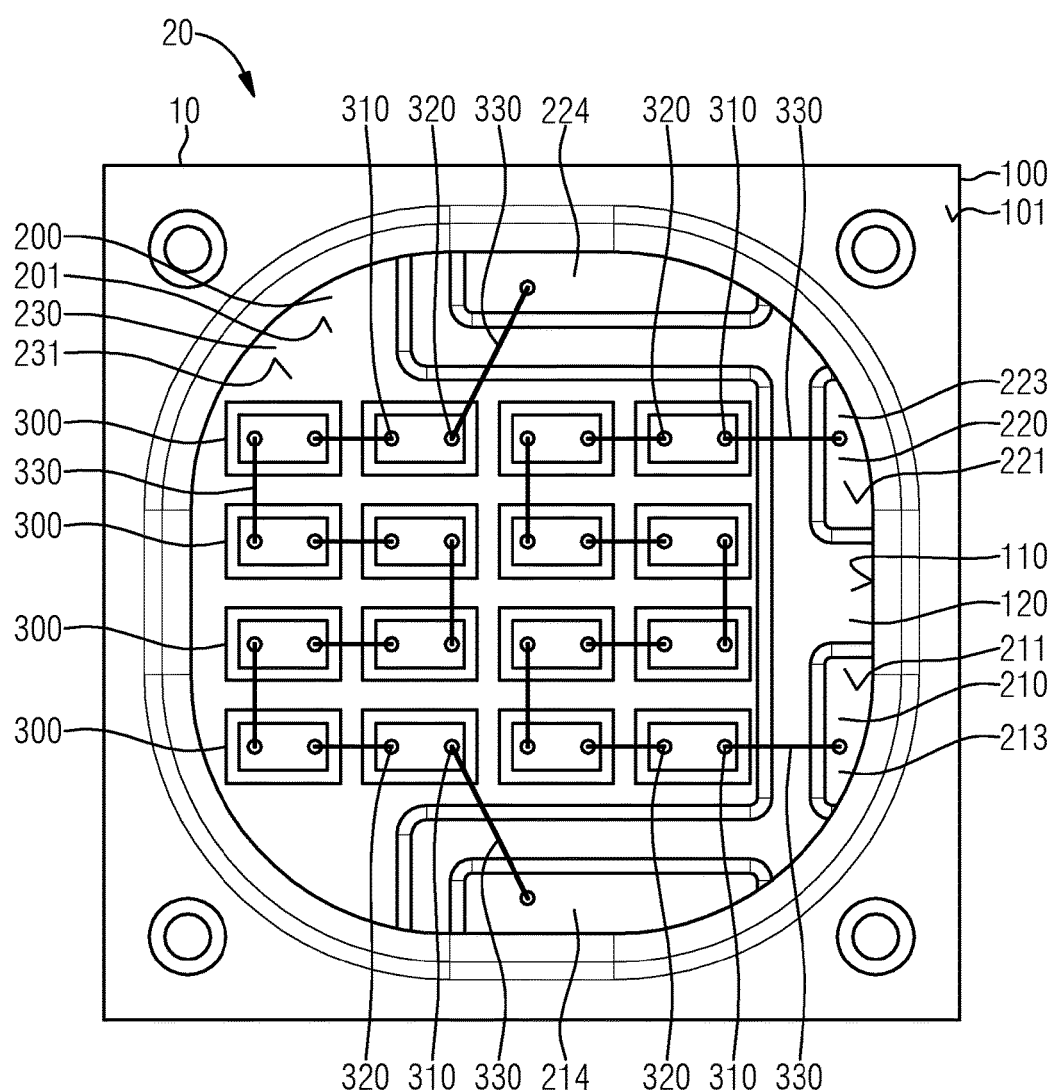
FIG. 7 schematically shows an electronic component according to a fourth example.

FIG. 7 shows a schematic top view of the electronic component 20 according to a fourth example. The fourth example of the electronic component 20 is similar to the second example of the electronic component 20 depicted in FIG. 5. In the following, only the differences between the fourth example of the electronic component 20 and the second example of the electronic component 20 are described.

In the fourth example, the electronic component 20 comprises sixteen electronic semiconductor chips 300 arranged on the upper side 231 of the third section 230 of the leadframe 200 in the cavity 110 of the housing 100 of the package 10. The sixteen electronic semiconductor chips 300 are divided into two groups. In each group, the electronic semiconductor chips 300 are arranged in a serial configuration. The two groups of electronic semiconductor chips 300 connect in parallel to the first section 210 and the second section 220 of the leadframe 200 of the package 10.

The first group electrically connects to the first part 213 of the upper side 211 of the first section 210 and to the first part 223 of the upper side 221 of the second section 220. The second group electrically connects to the second part 214 of the upper side 211 of the first section 210 and the second part 224 of the upper side 221 of the second section 220.

In other examples, the electronic component 20 may comprise only one electronic semiconductor chip 300 or another number of electronic semiconductor chips 300. The electronic semiconductor chips 300 may be arranged in any combination of serial and parallel configurations.

Figure 8:
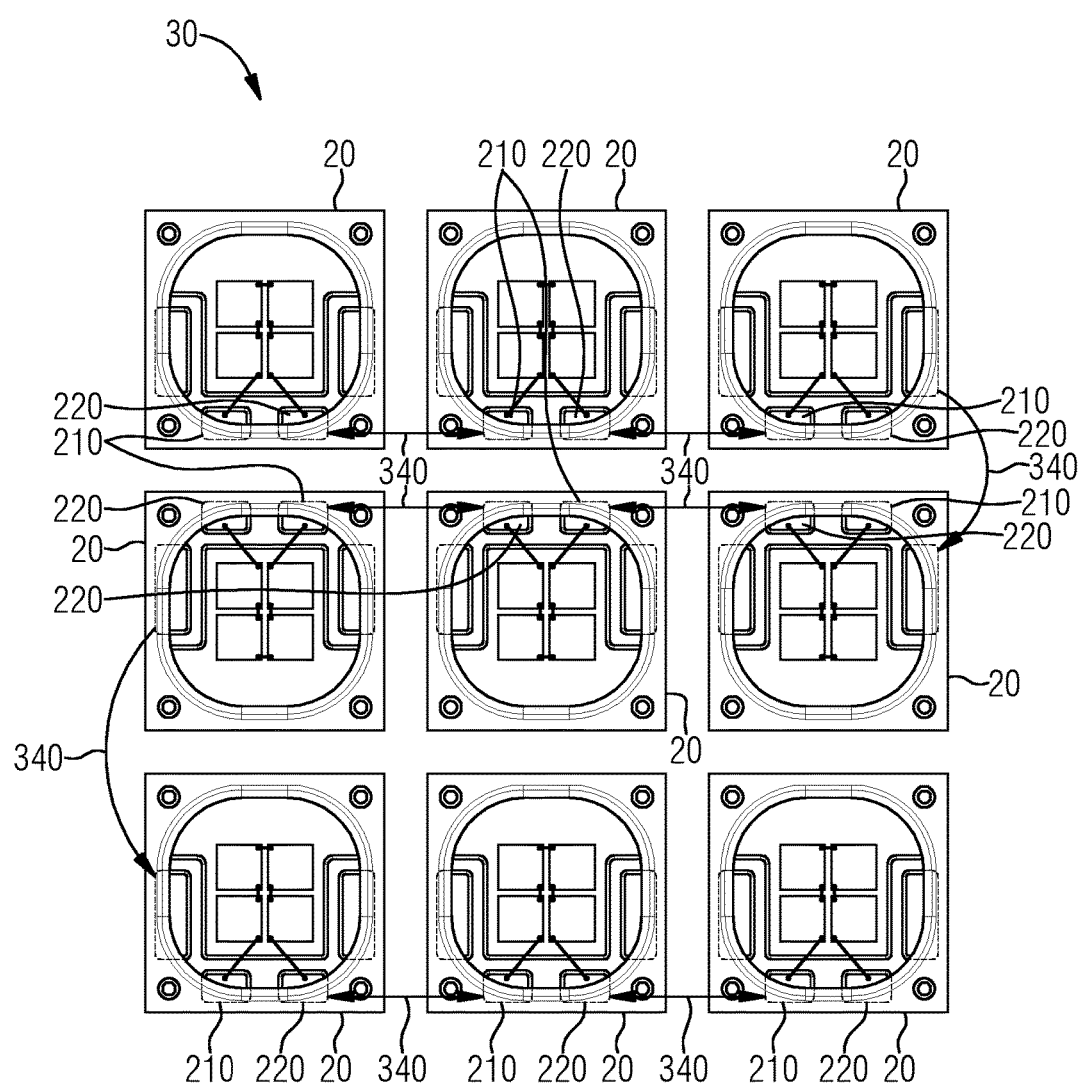
FIG. 8 schematically shows an electronic arrangement according to a first example.

FIG. 8 shows a schematic top view of an electronic arrangement 30. The electronic arrangement 30 comprises nine electronic components 20 according to one of the examples described in conjunction with FIGS. 4 to 7. The electronic components 20 are arranged in a regular grid pattern of three rows and three columns. The electronic components 20 electrically connect in a serial configuration via conductive connections 340. The conductive connections 340 may, for example, be designed as conductive paths arranged on a carrier on which the electronic components 20 are mounted. In the serial configuration of the electronic components 20, the second contact pad 320 of each electronic component 20 electrically connects to the first contact pad 310 of the following electronic component 20 via one of the conductive connections 340. The first contact pad 310 of the first electronic component 20 and the second contact pad 320 of the last electronic component 20 of the serial configuration electrically connect to external anode and cathode connections.

Figure 9:
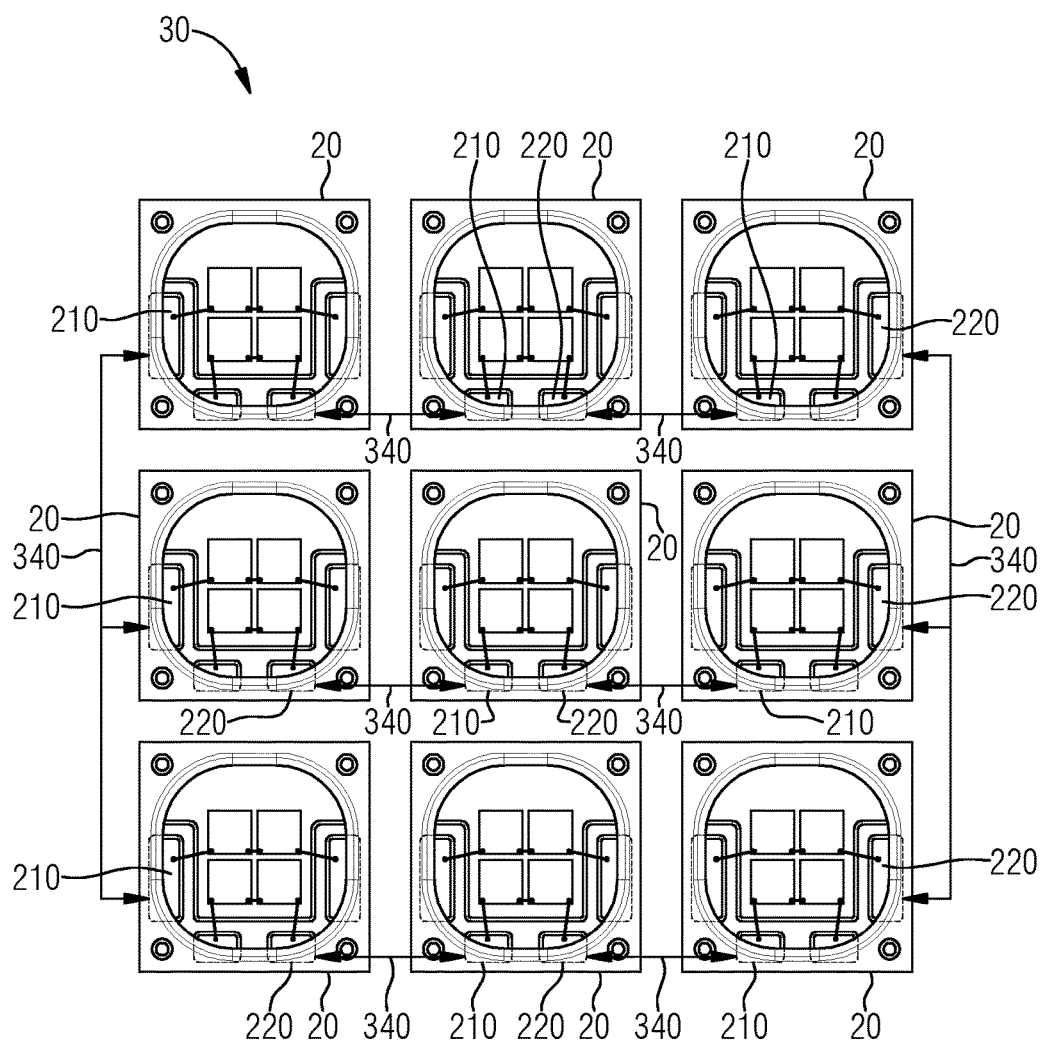
FIG. 9 schematically shows an electronic arrangement according to a second example.

FIG. 9 shows a schematic top view of the electronic arrangement 30 according to a second example. The second example of the electronic arrangement 30 is similar to the first example of the electronic arrangement 30 depicted in FIG. 8. In the following, only the differences between the second example of the electronic arrangement 30 and the first example of the electronic arrangement 30 are described.

In the second example of the electronic arrangement 30, the nine electronic components 20 are divided into three groups of three electronic components 20 each. In each group, the three electronic components 20 of that group electrically connect in a serial configuration. The three groups of serially connected electronic components 20 electrically connect in a parallel configuration.

It is possible, to build electronic arrangements comprising a different number of electronic components 20. An electronic arrangement 30 may, for example, comprise only one electronic component 20, two electronic components 20 or any other number of electronic components 20. The electronic components 20 of an electronic arrangement 30 may electrically connect in any combination of serial configurations and parallel configurations.

Our packages, components and arrangements are illustrated and described in greater detail on the basis of preferred examples. None the less, this disclosure is not restricted to the disclosed examples. Rather, other variations can be derived therefrom by those skilled in the art, without leaving the scope of protection of the appended claims.

The invention claimed is:

1. A package for an electronic component comprising a housing and a leadframe embedded in the housing,
   wherein the leadframe comprises a first section, a second section and a third section electrically isolated from one another, and is in a flat shape,
   the first section and the second section each comprise an L-shape,
   at least parts of bottom sides of the first section, the second section and the third section of the leadframe are exposed at a bottom side of the housing,
   the housing comprises a cavity, and
   at least parts of upper sides of the first section, the second section and the third section of the leadframe are exposed in the cavity.

2. The package according to claim 1, wherein the first section and the second section are mirror symmetric with respect to each other.

3. The package according to claim 2, wherein the leadframe is mirror symmetric.

4. The package according to claim 1, wherein the third section comprises a first clearance and a second clearance, the first clearance and the second clearance each comprise an L-shape, and the first section is arranged in the first clearance and the second section is arranged in the second clearance.

5. The package according to claim 1, wherein a first part and a second part of the upper side of the first section are exposed in the cavity, and a fillet of the housing covers an area of the upper side of the first section between the first part and the second part.

6. An electronic component comprising a package according to claim 5, and an electronic semiconductor chip arranged in the cavity on the upper side of the third section.

7. An electronic component comprising a package according to claim 1, and an electronic semiconductor chip arranged in the cavity on the upper side of the third section.

8. The electronic component according to claim 7, further comprising at least another electronic semiconductor chip arranged on the upper side of the third section, and at least the electronic semiconductor chip and the another electronic semiconductor chip electrically connect to the first section and the second section in a serial configuration.

9. An electronic arrangement comprising at least two electronic components according to claim 8.

10. The electronic component according to claim 7, further comprising at least another electronic semiconductor chip arranged on the upper side of the third section, and at least the electronic semiconductor chip and the another electronic semiconductor chip electrically connect to the first section and the second section in a parallel configuration.

11. An electronic arrangement comprising at least two electronic components according to claim 10.

12. An electronic arrangement comprising at least two electronic components according to claim 7.

13. The electronic arrangement according to claim 12, wherein the at least two of the electronic components electrically connect in a serial configuration.

14. The electronic arrangement according to claim 12, wherein the at least two of the electronic components electrically connect in a parallel configuration.

* * * * *